(12) United States Patent
van de Beek et al.

(10) Patent No.: US 9,876,631 B2
(45) Date of Patent: Jan. 23, 2018

(54) DIGITAL SYNCHRONIZER

(71) Applicant: NXP B.V., Eindhoven (NL)

(72) Inventors: Remco van de Beek, Eindhoven (NL); Jos Verlinden, Eindhoven (NL); Ghiath Al-kadi, Gratkorn (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/085,776

(22) Filed: Mar. 30, 2016

(65) Prior Publication Data

US 2016/0294541 A1    Oct. 6, 2016

(30) Foreign Application Priority Data

Mar. 30, 2015    (EP) .................................... 15161762

(51) Int. Cl.
*H04L 7/06* (2006.01)
*H04L 7/033* (2006.01)
*G06F 1/03* (2006.01)
*H03L 7/099* (2006.01)
*H03L 7/23* (2006.01)
*H04B 5/00* (2006.01)
*H04L 29/12* (2006.01)

(52) U.S. Cl.
CPC ............ *H04L 7/033* (2013.01); *G06F 1/0321* (2013.01); *H03L 7/0992* (2013.01); *H03L 7/23* (2013.01); *H04B 5/0031* (2013.01); *H04L 61/1552* (2013.01)

(58) Field of Classification Search
CPC ..... H04L 7/0079; H04L 7/0331; H03L 7/235; H03L 7/14; H03L 7/23; H03L 7/0992

USPC ........................................................ 375/364
See application file for complete search history.

(56) References Cited

U.S. PATENT DOCUMENTS

| 5,528,308 A * | 6/1996 | Alelyunas ................. H04N 5/04 348/512 |
| 5,563,535 A * | 10/1996 | Corry ..................... G06F 1/0328 327/105 |
| 5,790,614 A | 8/1998 | Powell |
| 6,294,936 B1 | 9/2001 | Clementi |

(Continued)

FOREIGN PATENT DOCUMENTS

| EP | 3076552 A1 * | 10/2016 | ........... H04B 5/0031 |
| EP | 3076553 A1 * | 10/2016 | ............. H03L 7/087 |

(Continued)

OTHER PUBLICATIONS

Sang-Min Yoo et al., "A Switched-Capacitor RF Power Amplifier," IEEE JSSC, vol. 46, No. 12, Dec. 2011.*

(Continued)

*Primary Examiner* — Daniel Washburn
*Assistant Examiner* — Berhanu Tadese

(57) ABSTRACT

A digital synchronizer is disclosed with a phase locked loop and a carrier generator. The phase locked loop is configured to produce an output signal having the same frequency as an input signal by selecting a divider ratio of a frequency divider with a control signal, the frequency divider divides the frequency of a high frequency signal by the divider ratio to provide the output signal; carrier generator is configured to generate an oversampled carrier signal by using the control signal to produce a carrier signal with a period corresponding with a contemporaneous period of the output signal.

14 Claims, 2 Drawing Sheets

(56) References Cited

U.S. PATENT DOCUMENTS

| | | | |
|---|---|---|---|
| 8,570,200 B2 | 10/2013 | Ashburn et al. | |
| 8,674,731 B1* | 3/2014 | Hellmer | H03L 7/0992 |
| | | | 327/147 |
| 8,749,282 B1* | 6/2014 | Basawapatna | H03L 7/104 |
| | | | 327/147 |
| 8,847,639 B1 | 9/2014 | Srivastava et al. | |
| 8,928,401 B2 | 1/2015 | Verlinden et al. | |
| 9,014,323 B2 | 4/2015 | Verlinden et al. | |
| 9,077,571 B2 | 7/2015 | van de Beek et al. | |
| 9,225,507 B1* | 12/2015 | Lye | H04L 7/0331 |
| 9,331,748 B2* | 5/2016 | Bernard | G06K 19/0723 |
| 2002/0024398 A1* | 2/2002 | Lagerblom | H04L 27/2071 |
| | | | 332/103 |
| 2003/0081653 A1* | 5/2003 | Hardin | H03L 7/193 |
| | | | 375/130 |
| 2005/0265483 A1 | 12/2005 | Erdogan | |
| 2006/0238301 A1* | 10/2006 | Wu | G06K 7/0008 |
| | | | 340/10.1 |
| 2007/0026893 A1* | 2/2007 | Sakamoto | H04B 1/3816 |
| | | | 455/558 |
| 2007/0115158 A1* | 5/2007 | Zoso | G06F 1/025 |
| | | | 341/143 |
| 2012/0071089 A1* | 3/2012 | Charrat | G06K 19/0723 |
| | | | 455/41.1 |
| 2012/0071090 A1* | 3/2012 | Charrat | G06K 19/07771 |
| | | | 455/41.1 |
| 2013/0107913 A1* | 5/2013 | Savoj | H03L 7/0891 |
| | | | 375/219 |
| 2013/0272368 A1* | 10/2013 | Yang | H04B 14/026 |
| | | | 375/238 |
| 2014/0003548 A1* | 1/2014 | Lefley | H04B 5/0075 |
| | | | 375/268 |
| 2014/0266611 A1* | 9/2014 | Breitfuss | G06K 7/10386 |
| | | | 340/10.1 |
| 2014/0341327 A1* | 11/2014 | Raggam | H04L 7/0331 |
| | | | 375/376 |
| 2014/0378051 A1* | 12/2014 | Charrat | G06K 19/07769 |
| | | | 455/41.1 |
| 2015/0063517 A1* | 3/2015 | Verlinden | H04L 7/0079 |
| | | | 375/376 |
| 2015/0180608 A1* | 6/2015 | van de Beek | G06K 19/067 |
| | | | 455/41.1 |
| 2016/0197718 A1* | 7/2016 | Michel | G06K 19/0723 |
| | | | 375/300 |
| 2016/0241380 A1* | 8/2016 | Ghahramani | H04L 7/0012 |

FOREIGN PATENT DOCUMENTS

| | | | | |
|---|---|---|---|---|
| WO | WO 2004100380 A1 * | 11/2004 | | G06F 7/68 |
| WO | WO 2015036682 A1 * | 3/2015 | | G06K 19/0723 |

OTHER PUBLICATIONS

Extended European Search Report for European Patent Application 15161762.8 dated Oct. 13, 2015.*

Extended European Search Report for EP Patent Application 15161762.8 (dated Oct. 13, 2015).

* cited by examiner

DIGITAL SYNCHRONIZER

CROSS-REFERENCE TO RELATED APPLICATIONS

This application claims the priority under 35 U.S.C. §119 of European patent application no. 15161762.8, filed on Mar. 30, 2015, the contents of which are incorporated by reference herein.

FIELD

The disclosure relates to a digital synchronizer for synchronizing a digitally generated signal to a signal received from a remote device.

BACKGROUND

When operating in card-emulation mode, a near field communication (NFC) device that operates according to the ISO14443 standard may use passive load modulation to communicate to the card reader/writer device. When doing so, the NFC device varies the load on a loop antenna in a way that can be sensed by the card reader/writer and such that it can decode the communicated bits.

A clear trend in NFC devices (e.g. in smart phones) is a decrease in the physical size of the loop antenna. When operating in card-emulation mode, the decrease in antenna size results in decreased signal strength received by the card reader/writer, under some circumstances to below the level required by the ISO14443 standard. To overcome this problem, the standard was recently amended with a new communication mode, labelled "active PICC transmission" (where PICC stands for proximity integrated circuit card, which is emulated in card-emulation mode). In this active PICC transmission mode, rather than varying the passive load on its antenna, the NFC device actively transmits a signal to the card reader/writer. This active mode allows larger signal strengths to be generated from a small NFC antenna, to a level that is compliant with the standard.

When operating in active PICC transmission mode, there is a new specification that the NFC device has to obey: the signal that is transmitted to the card reader/writer has to be imposed on a carrier signal that is synchronous to the unmodulated carrier that is transmitted at the same time by the card reader/writer. One way of achieving this is disclosed in US2015/0063517. In that disclosure, a digital phase-locked loop (PLL) is used that locks to the incoming carrier (generated by the card reader/writer) before active transmission commences. Right before active transmission starts, the PLL settings are frozen such that the PLL continues to generate a signal that is synchronous to the card reader/writer carrier. This PLL output signal is then used as the carrier to which the active transmission symbols are imposed.

FIG. 1 shows a block diagram of a PLL 100 disclosed by US2015/0063517. The output clkFc is synchronized to an input signal Frx by modulating the post divider ratio /P in a fractional manner using a digital PLL.

The digital PLL comprises a digital phase detector 110, digital loop filter 115, and sigma delta modulator 120. The digital phase detector 110 receives the input signal Frx and a feedback signal, and outputs a phase error between these two signals. The digital loop filter 115 receives the phase error from the digital phase detector 110, performs a filtering operation on the phase error, and provides an input signal to the sigma-delta modulator 120. The sigma-delta modulator 120 provides a control signal Pctrl to post divider 130 of a further phase locked loop.

The further phase locked loop comprises a phase detector 135, loop filter 140, frequency controlled oscillator 145, feedback divider 125 and post divider 130. The phase detector 135 is configured to determine a phase difference between a reference signal Fref and a feedback signal output from the feedback divider 125. The loop filter 145 receives the output from the phase detector 135, performs a filtering operation, and provides the result as a control input to the frequency controlled oscillator 145. The output clkHF from the frequency controlled oscillator 145 is provided to the feedback divider 125, which divides the frequency of clkHF by a ratio /M, and provides the result as the feedback signal to the phase detector 135. The output clkHF from the frequency controlled oscillator 145 is also provided to the post-divider 135, which divides the frequency of clkHF by a ratio /P.

The output clkFc of the post-divider 130 is the output signal clkFc that is synchronized to the incoming carrier signal Frx by controlling the post-divider ratio /P in a fractional manner using the sigma-delta modulator 120. The instantaneous integer division ratio /P is varied over time, yielding a non-integer average division ratio. As such, the output signal clkFc of the post-divider 130, being equal in frequency to Frx, can be used directly as the carrier that is to be transmitted back to the card reader/writer.

A carrier signal that is oversampled is desirable in some circumstances. For instance, oversampling may spread a quantization error of the DAC over a large frequency range, or ensure that DAC spectral replicas appear at high enough frequencies to be filtered effectively.

An arrangement that allows a synchronized, oversampled carrier signal is therefore desired.

SUMMARY

According to a first aspect, there is provided a digital synchronizer, comprising:

a phase locked loop configured to produce an output signal having the same frequency as an input signal by selecting a divider ratio of a frequency divider with a control signal, the frequency divider configured to divide the frequency of a high frequency signal by the divider ratio to provide the output signal;

a carrier generator comprising a look-up table, the carrier generator configured to generate an oversampled carrier signal using the look-up-table by using the control signal to produce a carrier signal with a period corresponding with a contemporaneous period of the output signal.

The carrier generator may be configured to receive the high frequency signal and to generate the carrier signal at a sample frequency that corresponds with a frequency of the high frequency signal, each period of the carrier signal having a number of samples that corresponds with the divider ratio selected by the contemporaneous control signal.

The sample frequency may be equal to the frequency of the high frequency signal, and each period of the carrier signal may have a number of samples that is equal to the divider ratio selected by the contemporaneous control signal. This is a particularly elegant and simple solution to providing an oversampled carrier that is synchronous with an input signal.

The sample frequency may be an integer multiple or ratio of the frequency of the high frequency signal and each period of the carrier signal may have a number of samples that is equal to the divider ratio selected by the contemporaneous control signal multiplied by the integer multiple or ratio. For instance, the sample frequency may be twice the frequency of the high frequency signal, and each period of the carrier signal may have a number of samples equal to twice the divider ratio (e.g. a frequency doubling arrangement may be used to increase the oversampling depth). Alternatively, the sample frequency may be half the frequency of the high frequency signal, and each period of the carrier signal may have a number of samples equal to half the divider ratio (e.g. a frequency divider may be used to decrease the oversampling depth).

The carrier generator may further comprise an address control block configured to select a stored value from the look-up table for each sample period of the carrier signal and to cause the carrier generator to produce a carrier signal value that corresponds with the stored value.

The look-up table may comprise N memory locations, and the address control block may comprise an address counter configured to select the stored value by identifying a memory location of the look-up table for each sample period. For a divider ratio of N, the address counter may increment with each sample period and reset after N sample periods.

For a divider ratio of N+1, the address counter may: increment for N sample periods, repeat an address location for one sample period, and reset after N+1 sample periods.

This provides a simple and low cost way for the carrier generator to track the divider ratio defined by the control signal.

The repeated address location may be an initial address location.

The carrier generator may comprise a digital-to-analog converter that receives a stored value from the look-up table and outputs a carrier signal value corresponding with the received stored value.

The phase locked loop may comprise a sigma-delta modulator that produces the control signal, the sigma-delta modulator being configured to produce a fractional average divider ratio in order to produce the output signal with the same frequency as the input signal.

The sigma-delta modulator may be a 1-bit sigma delta modulator. The frequency divider may be configured to provide a divider ratio of N when the control signal is in a first state, and N+1 when the control signal is in a second state.

The digital synchronizer may comprise a further phase locked loop configured to produce the high frequency signal, the further phase locked loop comprising a phase detector configured to determine a phase error between a feedback signal and a reference signal, a loop filter configured to perform a filtering operation on a phase error output by the phase detector, a frequency controlled oscillator configured to produce the high frequency signal in response to an output from the loop filter, and a feedback frequency divider configured to receive the high frequency signal and to output the feedback signal.

The phase locked loop may comprise: a digital phase detector configured to determine a phase error between the input signal and the output signal and a digital loop filter configured to perform a filtering operation on the phase error output from the digital phase detector to produce a digital loop filter output signal.

The digital loop filter may be responsive to a freeze input signal to lock the value of the digital loop filter output signal.

According to a second aspect, there is provided a near field communications device, which may be operable in an active PICC transmission mode, comprising the digital synchronizer of any preceding claim.

These and other aspects of the disclosure will be apparent from, and elucidated with reference to, the embodiments described hereinafter.

BRIEF DESCRIPTION OF DRAWINGS

Embodiments will be described, by way of example only, with reference to the drawings, in which.

Figure 1:
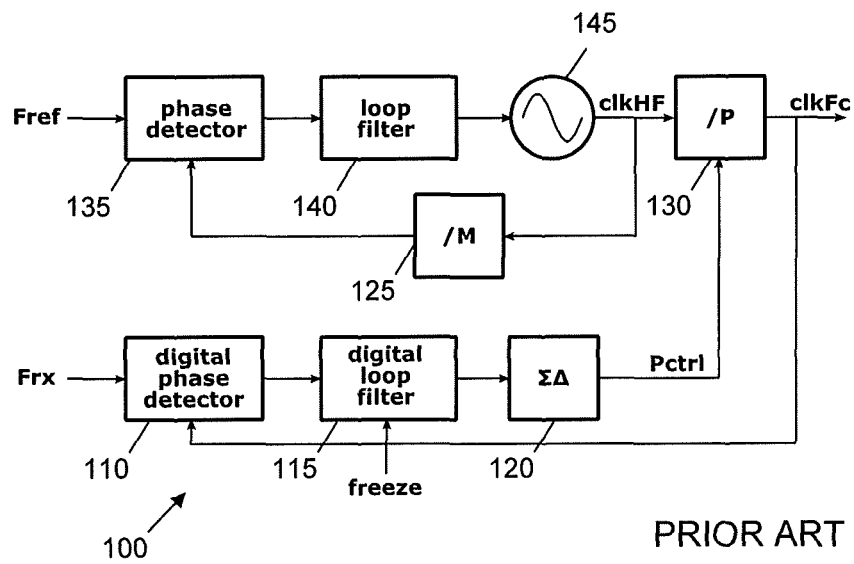
FIG. 1 is a block diagram of a prior art phase locked loop for clock synchronization.

It should be noted that the figures are diagrammatic and not drawn to scale. Relative dimensions and proportions of parts of these figures have been shown exaggerated or reduced in size, for the sake of clarity and convenience in the drawings. The same reference signs are generally used to refer to corresponding or similar features in modified and different embodiments.

DETAILED DESCRIPTION OF EMBODIMENTS

Figure 2:
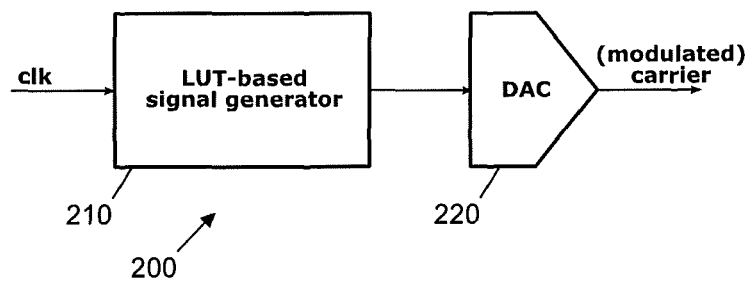
FIG. 2 is a block diagram of a look-up table based signal generator.

One way of generating an oversampled carrier signal is to use a look-up table 210 and DAC 220, as shown in FIG. 2. The oversampling signal generator 200 receives a clock signal clk, which has a frequency that is an integer multiple of the desired output carrier frequency (modulated carrier). For each cycle of the clock signal clk, the look-up table signal generator 210 looks up a stored digital value, and outputs this stored value to the DAC 220, which, in response, outputs an analog carrier (modulated carrier in FIG. 2) having values corresponding with the stored values provided to the DAC 220 by the look-up table 210.

If the transmitter of an NFC device is to generate its carrier using an oversampled digital-to-analog converter (DAC), a problem arises. An oversampling DAC based carrier generator requires a clock input that is higher in frequency than the carrier, in order to oversample the output signal. This high frequency clock preferably has a frequency that is an integer multiple of the carrier frequency, thus allowing a simple look-up table (LUT) based signal generation approach. Such a LUT may store exactly one period of the output wave and the DAC would then play back the content of this LUT in a looped fashion to generate the output carrier.

Referring to the PLL implementation of FIG. 1, it can be seen that none of the nodes comprises a clock with a frequency that is an integer multiple of the carrier frequency. The post-divider 130 outputs the carrier frequency by being controlled by the digital PLL in a fractional manner as described above. Since the average division ratio is fractional (non-integer) the input frequency of the post-divider (clkHF) is a non-integer multiple of the output frequency (clkFc). Therefore, simply using the post-divider input clock clkHF as the input of a LUT-based signal generator 200 as shown in FIG. 2 would yield a carrier output frequency from the signal generator 200 that is not equal to the incoming carrier frequency Frx.

Figure 3:
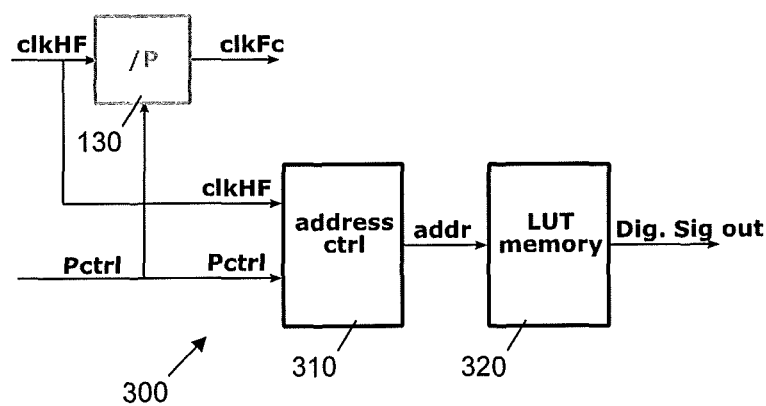
FIG. 3 is a block diagram of a digital signal generator.

Referring to FIG. 3, a digital signal generator 300 according to an embodiment is shown, comprising address control block 310 and look-up table (LUT) 320.

This digital signal generator 300 is for use with a phase locked loop that comprises a post-divider 130 that defines a frequency of an output signal clkFc from the phase locked loop (e.g. as shown in FIG. 1). Such a phase locked loop may be configured to produce an output signal clkFc having the same frequency as an input signal by controlling a divider ratio /P of a frequency divider 130 with a control signal Pctrl, the frequency divider 130 configured to divide the frequency of a high frequency signal clkHF by the divider ratio /P to provide the output signal clkFc.

The address control block 310 receives both the high frequency signal clkHF and the control signal Pctrl. The address control block 310 provides a memory address signal addr to the LUT 320, corresponding with a memory address location of the LUT 320. In response to the memory address signal addr, the LUT 320 outputs the stored digital value corresponding with the memory address location defined by the addr signal as a digital output signal Dig.Sig.out. The digital output signal Dig.Sig.out may be used as an input to a DAC, so as to generate an analog output waveform (e.g. a carrier signal).

The address control block 310 is configured to use the control signal Pctrl to request address locations addr from the LUT 320 such that the period of a waveform defined by the output Dig.Sig.out from the LUT 320 corresponds with a contemporaneous period of the output signal clkFc.

The address control block 310 can be thought of as a programmable divider, similar to the post-divider 130 itself. The number of samples that the LUT-based signal generator 300 outputs to create one period of the carrier wave shape (defined by Dig.Sig.out) tracks the divider ratio /P of the post divider 130. The address control block 310 does this by observing the control signal Pctrl and following suit.

For example, when the post-divider /P is able to either divide by N or by N+1 (N being some integer number) such that the fractional division ratio is somewhere between N and N+1, the LUT-based signal generator 300 is configured to either create a wave shape period that consists of N samples, or a wave shape period that consists of N+1 samples. The actual number of samples produced by the signal generator 300 in one period of the carrier signal tracks the divider ratio /P.

In this way, the generated carrier signal period is always exactly equal to the period of the post divider output signal clkFc. Since the post divider output signal clkFc is synchronized with and has the same frequency as the incoming carrier signal, the output carrier signal from the signal generator 300 will also have the correct frequency, as demanded by the standard.

One way to realize a LUT-based signal generator is to combine a LUT 320 with an address control block 310 that generally advances the output address location by 1 every input clock period. The LUT logic outputs the data value corresponding to the address location requested by the address control block 310, such that the internally stored samples are generally output in order. If the end address location of the LUT is reached, the address counter wraps around to the start of the address locations of the LUT, thus resulting in the looped playback of the LUT contents. If the LUT contains N samples, the address control block 310 creates a periodic signal with a period of N clock cycles. As such, the address control block can be viewed to be equivalent to a frequency divider with ratio N.

If the LUT-based signal generator is provided with the same signal Pctrl that controls the frequency division ratio of the post-divider 130, the address control block 310 can therefore be configured such that its period tracks that of the post divider.

Producing a period time of N+1 clock cycles in the address generator can be done by outputting a value stored at one of the memory addresses twice (e.g. for a duration of two rather than one clock cycles), thus adding one clock cycle to the period time. This may only be done during a period where the post-divider ratio equals N+1.

Figure 4:
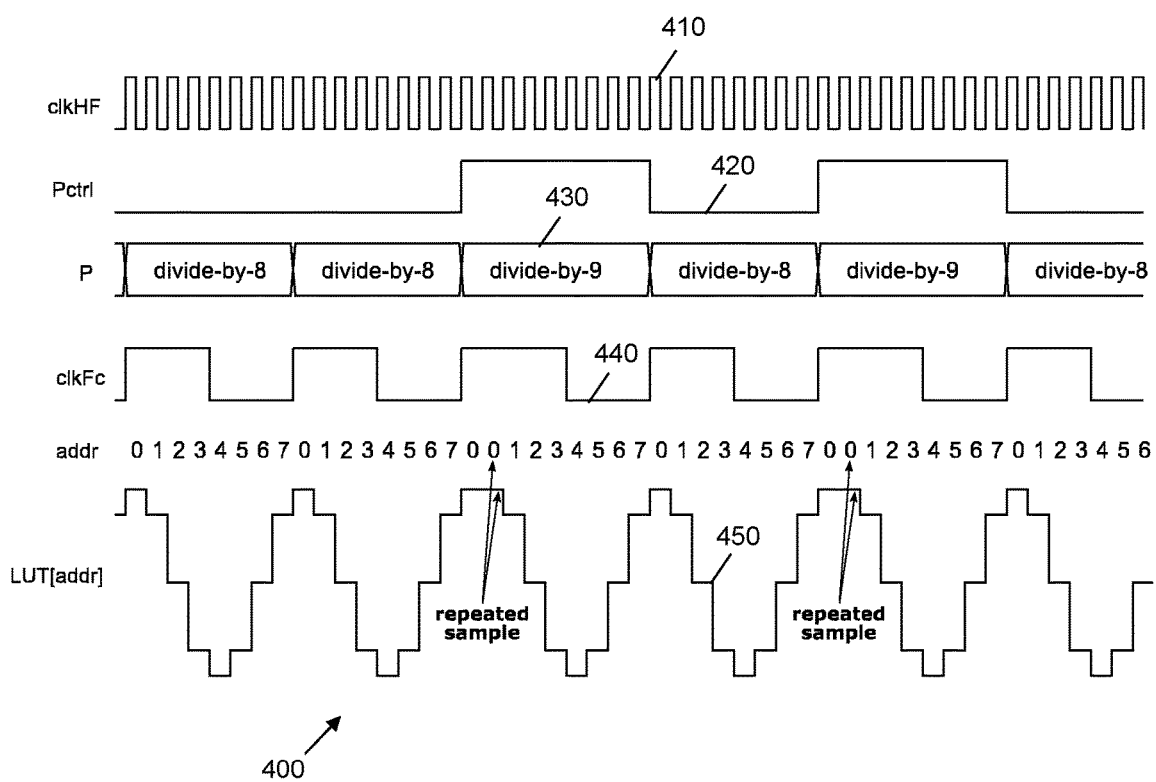
FIG. 4 is a timing diagram illustrating the operation of an embodiment.

FIG. 4 illustrates the operation of an example embodiment, showing the high frequency signal (clkHF) 410, control signal (Pctrl) 420, divider ratio (/P) 430, output signal (clkFc) 440, address location (addr) and the stored value corresponding with the address location (LUT[addr]).

In FIG. 4, eight samples of a sine wave are stored in the LUT 320 (N=8). Whenever the post-divider 130 divides by N+1=9 due to signal Pctrl being set to 1, the address control block follows this behaviour by outputting address location 0 twice. This results in the period of the waveform defined by the output signal from the LUT 320 having a period that is the same as the contemporaneous period of the output signal clkFc, as is clearly illustrated in FIG. 4.

The following pseudo-code describes the functionality of the address control block:

```
1    /* inputs:
2             clk:       input clock
3             Pctrl:     if 1, indicates address repetition should occur this period
4             N:         # of addressable words in look-up table
5        outputs :
6             addr:      address control of LUT-based signal gen
7    */
8    if (rising edge of clk)
9         if (addr == 0 AND Pctrl == 1 AND addval == 1) /* repeat sample? */
10            addval = 0
11        else
12            addval = 1
13        endif
14        addr = addr + addval /* advance address by 1 (or 0 if sample repeat) */
15        if (addr == N)       /* Wrap to start */
16            addr = 0
17        endif
18        SEND addr TO OUTPUT
19   endif
```

From reading the present disclosure, other variations and modifications will be apparent to the skilled person. Such variations and modifications may involve equivalent and other features which are already known in the art of time to digital converters and phase locked loops, and which may be used instead of, or in addition to, features already described herein.

Although the appended claims are directed to particular combinations of features, it should be understood that the scope of the disclosure also includes any novel feature or any novel combination of features disclosed herein either explicitly or implicitly or any generalisation thereof, whether or not it relates to the same subject matter as presently claimed in any claim and whether or not it mitigates any or all of the same technical problems.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality and reference signs in the claims shall not be construed as limiting the scope of the claims.

The invention claimed is:

1. A digital synchronizer, comprising:
a phase locked loop configured to produce an output signal having the same frequency as an input signal by selecting a divider ratio of a frequency divider with a control signal, the frequency divider configured to divide the frequency of a high frequency signal by the divider ratio to provide the output signal;
a carrier generator comprising a look-up table, the carrier generator configured to generate an oversampled carrier signal using the look-up-table by using the control signal to produce a carrier signal with a period corresponding with a contemporaneous period of the output signal; and
wherein the carrier generator further comprises an address control block configured to receive both the high frequency signal and the control signal and to select a stored value from the look-up table for each sample period of the carrier signal and to cause the carrier generator to produce the carrier signal that is obtained using the stored value and that is at a sample frequency that corresponds with a frequency of the high frequency signal, wherein the sample frequency is an integer multiple or ratio of the frequency of the high frequency signal.

2. The digital synchronizer of claim 1, wherein the carrier generator is configured to receive the high frequency signal and to generate the carrier signal at the sample frequency that corresponds with the frequency of the high frequency signal, each period of the carrier signal having a number of samples that corresponds with the divider ratio selected by the contemporaneous control signal.

3. The digital synchronizer of claim 2, wherein the sample frequency is equal to the frequency of the high frequency signal, and each period of the carrier signal has a number of samples that is equal to the divider ratio selected by the contemporaneous control signal.

4. The digital synchronizer of claim 1, wherein the look-up table comprises N memory locations, and the address control block comprises an address counter configured to select the stored value by identifying a memory location of the look-up table for each sample period, wherein for a divider ratio of N, the address counter increments with each sample period and resets after N sample periods.

5. The digital synchronizer of claim 4, wherein for a divider ratio of N+1, the address counter: increments for N sample periods, repeats an address location for one sample period and resets after N+1 sample periods.

6. The digital synchronizer of claim 5, wherein the repeated address location is an initial address location.

7. The digital synchronizer of claim 1, wherein the carrier generator comprises a digital-to-analog converter that receives a stored value from the look-up table and outputs a carrier signal value corresponding with the received stored value.

8. The digital synchronizer of claim 1, wherein the phase locked loop comprises a sigma-delta modulator that produces the control signal, the sigma-delta modulator being configured to produce a fractional average divider ratio in order to produce the output signal with the same frequency as the input signal.

9. The digital synchronizer of claim 1, wherein the sigma-delta modulator is a 1-bit sigma delta modulator, and the frequency divider is configured to provide a divider ratio of N when the control signal is in a first state, and N+1 when the control signal is in a second state.

10. The digital synchronizer of claim 1, comprising a further phase locked loop configured to produce the high frequency signal, the further phase locked loop comprising a phase detector configured to determine a phase error between a feedback signal and a reference signal, a loop filter configured to perform a filtering operation on a phase error output by the phase detector, a frequency controlled oscillator configured to produce the high frequency signal in response to an output from the loop filter, and a feedback frequency divider configured to receive the high frequency signal and to output the feedback signal.

11. The digital synchronizer of claim 1, wherein the phase locked loop comprises: a digital phase detector configured to determine a phase error between the input signal and the output signal and a digital loop filter configured to perform a filtering operation on the phase error output from the digital phase detector to produce a digital loop filter output signal.

12. The digital synchronizer of claim 11, wherein the digital loop filter is responsive to a freeze input signal to lock the value of the digital loop filter output signal.

13. A digital synchronizer, comprising:
a phase locked loop configured to produce an output signal having the same frequency as an input signal by selecting a divider ratio of a frequency divider with a control signal, the frequency divider configured to divide the frequency of a high frequency signal by the divider ratio to provide the output signal; and
a carrier generator comprising a look-up table, the carrier generator configured to generate an oversampled carrier signal using the look-up-table by using the control signal to produce a carrier signal with a period corresponding with a contemporaneous period of the output signal, wherein the carrier generator is configured to receive the high frequency signal and to generate the carrier signal at a sample frequency that corresponds with a frequency of the high frequency signal, each period of the carrier signal having a number of samples that corresponds with the divider ratio selected by the contemporaneous control signal, and wherein the sample frequency is an integer multiple or ratio of the frequency of the high frequency signal and each period of the carrier signal has a number of samples that is equal to the divider ratio selected by the contemporaneous control signal multiplied by the integer multiple or ratio.

14. A near field communications device, operable in an active proximity integrated circuit card (PICC) transmission mode, comprising the digital synchronizer of claim 13.

* * * * *